US008058737B2

(12) United States Patent
Hasegawa et al.

(10) Patent No.: US 8,058,737 B2
(45) Date of Patent: Nov. 15, 2011

(54) ELECTRONIC ELEMENT WAFER MODULE AND METHOD FOR MANUFACTURING ELECTRONIC ELEMENT WAFER MODULE, ELECTRONIC ELEMENT MODULE AND METHOD FOR MANUFACTURING ELECTRONIC ELEMENT MODULE, AND ELECTRONIC INFORMATION DEVICE

(75) Inventors: Masahiro Hasegawa, Osaka (JP); Aiji Suetake, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 234 days.

(21) Appl. No.: 12/540,111

(22) Filed: Aug. 12, 2009

(65) Prior Publication Data
US 2010/0052192 A1    Mar. 4, 2010

(30) Foreign Application Priority Data

Aug. 26, 2008  (JP) .................. 2008-217286

(51) Int. Cl.
*H01L 23/544* (2006.01)
(52) U.S. Cl. ............. 257/797; 257/98; 257/E23.179; 257/E21.54; 257/E21.122; 438/401
(58) Field of Classification Search ............. 257/98, 257/797, E23.179, E21.54, E21.122; 438/401
See application file for complete search history.

(56) References Cited

FOREIGN PATENT DOCUMENTS

| CN | 1967854 | 5/2007 |
|---|---|---|
| JP | 62-052503 | 3/1987 |
| JP | 2001-035972 | 2/2001 |
| JP | 2001-118865 | 4/2001 |
| JP | 2002-246613 | 8/2002 |
| JP | 2003-204053 | 7/2003 |
| JP | 2004-226872 | 8/2004 |
| JP | 2004-233482 | 8/2004 |
| JP | 2007-047779 | 2/2007 |
| JP | 2007-128979 | 5/2007 |
| JP | 2007-180653 | 7/2007 |
| JP | 2008-085195 | 4/2008 |
| JP | 2008-092417 | 4/2008 |
| WO | 2006/073085 | 7/2006 |

OTHER PUBLICATIONS

Chinese Office Action and English language translation mailed Sep. 7, 2010 in corresponding Chinese Patent Application 200910166685.6.

*Primary Examiner* — Tan N Tran
(74) *Attorney, Agent, or Firm* — David G. Conlin; Steven M. Jensen; Edwards Angell Palmer & Dodge LLP

(57) ABSTRACT

An electronic element wafer module is provided, in which a transparent support substrate is disposed facing a plurality of electronic elements formed on a wafer and a plurality of wafer-shaped optical elements are disposed on the transparent support substrate, where a groove is formed along a dicing line between the adjacent electronic elements, penetrating from the optical elements through the transparent support substrate, with a depth reaching a surface of the wafer or with a depth short of the surface of the wafer; and a light shielding material is applied on side surfaces and a bottom surface of the groove or is filled in the groove, and the light shielding material is applied or formed on a peripheral portion of a surface of the optical element, except for on a light opening in a center of the surface.

52 Claims, 8 Drawing Sheets

ELECTRONIC ELEMENT WAFER MODULE AND METHOD FOR MANUFACTURING ELECTRONIC ELEMENT WAFER MODULE, ELECTRONIC ELEMENT MODULE AND METHOD FOR MANUFACTURING ELECTRONIC ELEMENT MODULE, AND ELECTRONIC INFORMATION DEVICE

This nonprovisional application claims priority under 35 U.S.C. §119(a) to Patent Application No. 2008-217286 filed in Japan on Aug. 26, 2008, the entire contents of which are hereby incorporated by reference.

BACKGROUND OF THE INVENTION

1. Field of the Invention

The present invention relates to an electronic element wafer module and a method for manufacturing the electronic element wafer module. In the electronic element wafer module, a plurality of lenses for focusing incident light or a plurality of optical function elements for directing output light straight and refracting and guiding incident light in a predetermined direction; and an image capturing element including a plurality of light receiving sections corresponding to respective lenses for performing a photoelectric conversion on and capturing an image of image light from a subject, or a light emitting element for emitting output light and a light receiving element for receiving incident light corresponding to respective optical function elements, are modularized (integrated) in a plural number. Further, the present invention relates to an electronic element module manufactured by simultaneously cutting the electronic element wafer module into each of the electronic element modules, and a method for manufacturing the electronic element module. Still further, the present invention relates to an electronic information device, such as a digital camera (e.g., a digital video camera or a digital still camera), an image input camera (e.g., a car-mounted camera), a scanner, a facsimile machine, a television telephone device, a camera-equipped cell phone device or a personal digital assistant (PDA), including a sensor module as an image input device (e.g., a car-mounted camera) used in an image capturing section of the electronic information device. The sensor module functioning as the electronic element module is manufactured by simultaneously cutting a sensor wafer module into individual pieces, the sensor wafer module functioning as the electronic element wafer module including: an image capturing element including therein a plurality of light receiving sections for performing a photoelectric conversion on and capturing an image of image light from a subject; and a lens for forming an image of incident light on the image capturing element, which are modularized (integrated) in a plural number. Further, the present invention relates to an electronic information device, such as a pick up apparatus, including the electronic element module used in an information recording and reproducing section thereof.

2. Description of the Related Art

In a conventional sensor module as an electronic element module of this type, a lens section for focusing incident light and an image capturing element corresponding to the lens section, which includes therein a plurality of light receiving sections for performing a photoelectric conversion on and capturing an image of incident light from a subject, are modularized. In the conventional sensor module, a current light shielding treatment for the image capturing element is mostly performed on the individualized sensor modules. The current light shielding treatment is performed, for example, by covering the individualized complete sensor module with a light shielding holder, by applying a light shielding material on the periphery and top portions of the sensor module, and by piling up light shielding blocks functioning as a sensor module. As one of the conventional light shielding treatments, Reference 1 proposes the application of a light shielding material on the periphery and top portions of the sensor module. In addition, Reference 2 proposes a process method for piling up light shielding blocks. Each of the proposals will be described hereinafter.

FIGS. 7(a) to 7(e) are each an essential part longitudinal cross sectional view illustrating each manufacturing step of the conventional semiconductor image capturing element of Reference 1.

As illustrated in FIG. 7(a), an image capturing area 102 in the middle portion and a peripheral circuit area 103 in an outer circumference area adjoining the image capturing area 102 are formed in an upper surface 101a of a semiconductor substrate 101. A plurality of electrode sections 104 are disposed on a further outer circumference side of the peripheral circuit area 103 on the upper surface 101a. Further, a plurality of microlenses 105 are provided on image capturing area 102 for focusing incident light on each light receiving section. Each of the plurality of microlenses 105 is provided to correspond to each pixel.

Here, as illustrated in FIG. 7(b), a bump 106 is provided on each of the electrode sections 104 on the further outer circumference side of the peripheral circuit area 103. The bump 106 may be formed, for example, by a wire bonder with a conductive wire. Connection surfaces of the bumps 106 are pressed by a plate-shaped metal plate after the bumps 106 are formed. The plate-shaped metal plate includes an opening larger than an optical member 108, which is composed of a lens section. Thus, the connection surfaces of the bumps 106 may be pressed by the plate-shaped metal plate, so that the height becomes even and the connection surfaces of the bumps 106 are planarized to be easily electrically connected with the conductive wire.

As illustrated in FIG. 7(c), a light shielding film 109 is provided in advance in a side surface area of an optical member 108 constituted of the lens section. The light shielding film 109 is formed with a metal or resin material which has a light shielding effect. Further, the optical member 108 has a shape that covers at least the image capturing area 102.

Next, as illustrated in FIG. 7(d), a transparent adhesive member 110, which is cured by ultraviolet rays, is applied in such a manner to cover the microlenses 105 and the peripheral circuit area 103 therearound in each semiconductor element 107. The transparent adhesive member 110 can be applied, for example, by painting, printing and stamping.

Further, as illustrated in FIG. 7(e), the optical member 108, which is constituted of the lens section, is disposed with respect to the image capturing area 102, which is applied with the transparent adhesive member 110. Subsequently, while the upper surface of the optical member 108 and the upper surface of the image capturing area 102 are maintained to be parallel, the optical member 108 is pressurized from the upper surface. Next, ultraviolet rays of wavelengths curing the transparent adhesive member 110 are irradiated on the upper surface side of the optical member 108 as illustrated by arrows 111. Because of the irradiation, the image capturing area 102 and the optical member 108 are adhered by the transparent adhesive member 110. As a result, the optical member 108 is adhered on the semiconductor element 107, and a semiconductor image capturing element 100A is obtained.

A plurality of semiconductor image capturing elements 100A, which are manufactured as described above, are in a semiconductor wafer shape, and adjacent semiconductor elements 107 are diced. By the dicing, individualized semiconductor image capturing element 100A can be obtained as illustrated in FIG. 7(e). As a result, the optical member 108 is adhered by the transparent adhesive member 110 directly on the microlenses 105 of the semiconductor element 107, thereby achieving the thinning. In this state, even if the transparent adhesive member 110 flows into the peripheral circuit area 103, it will not be a problem since the bump 106 is connected onto the electrode section 104 and the bump 106 is formed higher than the height of the surface 101a of the transparent adhesive member 110, thereby providing no possibility of failing to adhere the conductive wire and achieving a high reliability. Further, it is only required to form the bump 106 on the electrode section 104 prior to the step of adhering the optical member 108. As a result, the productivity is increased without spoiling the mass productivity.

Subsequently, as illustrated in FIG. 8, a light shielding member 112 is further provided. The light shielding member 112 includes an exposed area 110a of the transparent adhesive member 110 and a side surface area 108a of the optical member 108. The light shielding member 112 is formed above the peripheral circuit area 103 in such a manner not to cover the electrode section 104 and the bump 106. In this case, the light shielding member 112 is applied such that the surface 112a of the light shielding member 112 is lower than the height of a connection surface 106a of a tip portion of the bump 106.

Next, FIGS. 9 and 10 illustrate the process method for piling up light shielding blocks as a light shielding treatment for the conventional sensor module.

FIG. 9 is an exploded perspective view illustrating a conventional compound eye image capturing apparatus of Reference 2 in an assembling state. FIG. 10 is a longitudinal cross sectional view of a holder member and a light shielding block portion, holding an optical lens array of the compound eye image capturing apparatus 200 in FIG. 9.

In FIGS. 9 and 10, a conventional compound eye image capturing apparatus 200 includes: an optical lens array 203; a holder member 204; a light receiving array 205; a light shielding block 206; and a frame member 207. The optical lens array 203 is formed with nine optical lenses 201 of three rows by three columns with respective optical axes L parallel to one another, integratedly formed as one side convex lenses on a lower surface of a single transparent substrate 202. The holder member 204 holds the optical lens array 203 in such a manner to hold it from top and bottom. The light receiving element array 205 is disposed below the optical lens array 203 to capture nine images formed by the optical lenses 201. The light shielding block 206 is disposed between the optical lens array 203 and the light receiving array 205 to divide a space between the optical lens array 203 and the light receiving array 205 on a surface orthogonal to the optical axis L so that light output from the optical lenses 201 will not interfere with one another. The frame member 207 is disposed between the light shielding block 206 and the light receiving array 205, and functions as a spacer for surrounding the light receiving array 205 like a picture frame to prevent the light shielding block 206 from touching the light receiving array 205.

The holder member 204 is constituted of an upper plate member 204a and a lower frame member 204b. The lower frame member 204b includes a groove formed therein for mating with an edge portion of the optical lens array 203. The upper plate member 204a is configured as an aperture member for shielding unnecessary incident light to the optical lenses 201 by forming apertures 204c of a predetermined size at nine positions corresponding to the optical lenses 201.

The light shielding block 206 is configured by laminating six sheet metal unit plates Pa which are 120 μm thick and further laminating thereon two sheet metal unit plates Pb which are 80 μm thick. That is, eight unit plates Pa and Pb of two different thicknesses are laminated. As a result, the light shielding block 206 of 880 μm total thickness is formed. The length consisting of the thickness of the light shielding block 206 and the thickness of the frame member 207 surrounding the light receiving array 205 and the holder member 204 of the optical lens array 203, is configured to be equal to the optical length of the optical lens 201.

Next, as a reference, a method for forming a light shielding film will be described as in Reference 3, where the light shielding film is formed on a surface except for above a light receiving lens.

FIG. 11 is an essential part longitudinal cross sectional view of a remote control light receiving module of Reference 3, which is one of conventional optical function modules.

As illustrated in FIG. 11, a remote control light receiving module 300, which is one of conventional optical function modules, is configured of: a lead frame 301; an infrared ray light receiving element 302 thereon; a processing circuit 303 for processing signals output from the infrared ray light receiving element 302; chip parts necessary for the processing circuit 303 installed and connected thereto; and a resin 304 for molding the above sections. A light shielding film 306 is formed on a flat part of the resin 304 except for on a light receiving lens portion 305. The light receiving lens portion 305 is molded by a material with the same quality as that of the resin 304.

The lead frame 301 is formed with a metal plate material, and its main component is any of Fe, Ni, Cu, or an alloy thereof. A surface of the lead frame 301 is coated with a film of Ag. As the form of the lead frame 301, the molded inside of the lead frame 301 is configured of several of separate parts in order to support the entire mold by a group of externally protruding terminals 307 as well as to electrically connect with the infrared ray light receiving element 302 and the processing circuit 303. The thickness of the lead frame 301 is 300 μm or more.

The infrared ray light receiving element 302 is disposed such that the center of the infrared ray light receiving element 302 and the center of the light receiving lens portion 305 are aligned. The size of the infrared ray light receiving element 302 can be 2 mm square or less depending on the light focusing performance of the light receiving lens portion 305. If the size becomes significantly larger than 3 mm square, the capacitive component of the infrared ray light receiving element 302 may become too large, causing the processing circuit 303 to operate improperly. Infrared rays entering the infrared ray light receiving element 302 through the light receiving lens portion 305 generate current signals at the infrared ray light receiving element 302. The current signals generated are signal-processed at the electrically connected processing circuit 303. The processing circuit 303 includes functions such as converting the input current signals into voltages, amplifying, filtering noise signal components except for remote control signals, detecting and rectifying.

The resin 304 is molded in such a manner to cover the processing circuit 303 and infrared ray light receiving element 302 installed on the lead frame 301. At the same time the resin 304 forms the light receiving lens section 305. The resin 304 has a function of cutting visible light, which rapidly decreases light of approximately 800 nm or less. However, the resin 304 does not completely prohibit the light with a wavelength of approximately 800 nm or less from passing, but some extent of optical noise occurs from strong light. Therefore, in this case, the distance is 500 μm or more from the infrared ray light receiving element 302 to the flat portion of the light receiving lens section 305 except for the convex portion. For example, an epoxy material is used for the resin 304. When a visible light cutting material with transmissivity for infrared rays from approximately 820 nm of an infrared ray wavelength is used for the resin 304, the transmissivity of 95% or more can be achieved at the wavelength band of 950 nm.

The light receiving lens section 305 is a lens for focusing infrared ray light transmitted from a remote control transmitter. The light receiving lens section 305 is a half sphere or a shape close to it, for example. The light receiving lens section 305 focuses infrared ray light which enters the light receiving lens section 305 onto the infrared ray light receiving element 302. Because of the effect of the lens, the effective light focusing effect of the infrared ray light, which enters the light receiving lens section 305, can be determined based on the refractive index for each wavelength, transmissivity, and light receiving area of the infrared ray light receiving element 302, which can be determined by the area accounting for the infrared ray light entering the light receiving lens section 305 in the vertical direction and the material. Herein, the effective light focusing effect of approximately 3 to 4 magnifications can be achieved by appropriately setting the refractive index, transmissivity, the area of the infrared ray light receiving element 302, and the area of the light receiving lens section 305, with respect to air in the vicinity of 950 nm.

The light shielding film 306 is formed on the surface except for on the portion of the light receiving lens section 305, which is a surface for receiving the infrared ray light. For example, a black-colored epoxy resin can be used as a material for the light shielding film 306. Besides, ABS, PP and PC can also be used as the material for the light shielding film 306. In addition, lacquer and enamel paints can be used as the material for the light shielding film 306. However, if a water-soluble paint, such as acrylic paint, is used as the material for the light shielding film 306, and if a hydrophilic treatment is not performed on the surface of the molded resin, there is a high possibility that spots will appear. For paint, the order of several μm may not be enough as the film thickness of the light shielding film 306, and spots will appear. In such a case, there may be a light scattering effect, but the light may not be decreased.

Thus, when the light shielding film 306 is formed on the surface except for on the light receiving lens section 305, the light receiving lens section 305 is covered with a mask. Next, using the mask, the light shielding film 306 is formed on the surface except for on the light receiving lens section 305. Subsequently, the mask is removed.

Reference 1: Japanese Laid-Open Publication No. 2008-92417

Reference 2: Japanese Laid-Open Publication No. 2007-180653

Reference 3: Japanese Laid-Open Publication No. 2002-246613

SUMMARY OF THE INVENTION

As described above, according to Reference 1, the optical member 108, such as a lens and a lid glass, as an optical element coated with a light shielding material as the light shielding film 109 on the side surface, is disposed on the image capturing area 102 of the sensor chip. Subsequently, the light shielding member 112 is applied in the vicinity of the optical member 108. According to Reference 2, the light shielding block 206 is piled up between the optical lens array 203 and the light receiving element array 205 to shield the periphery from light, and as a result, the light shielding structure is formed. Reference 3 merely discloses one example of a method for forming the light shielding film 304 at portions except for the lens.

According to such conventional light shielding structures described above, production efficiency is poor since the step of the light shielding treatment is divided in two as in Reference 1. Further, the light shielding block is separately required to achieve the light shielding structure as in Reference 2. Further, such light shielding treatments are performed one by one at a process for individual pieces, which makes production efficiency extremely poor.

The present invention is intended to solve the conventional problems described above. The objective of the present invention is to provide an electronic element wafer module and a method for manufacturing the electronic element wafer module, where unlike the conventional methods, a light shielding treatment step is not performed in several steps and the light shielding block is not separately required to achieve the light shielding structure; and where a light shielding material can be disposed in one step at a portion required to be shielded in a wafer state and necessary portions can be simultaneously cut to be individualized, so that the light shielding structure can be obtained easily and quickly, thereby achieving a high production efficiency. Further, the objective of the present invention is to provide an electronic element module, which is individualized from the electronic element wafer module and a method for manufacturing the electronic element module. Further, the objective of the present invention is to provide an electronic information device, such as a camera-equipped cell phone device, including the electronic element module used as an image input device in an image capturing section thereof; and an electronic information device, including the electronic element module used in an information recording and reproducing section thereof.

An electronic element wafer module according to the present invention is provided, in which a transparent support substrate is disposed facing a plurality of electronic elements formed on a wafer and a plurality of wafer-shaped optical elements are disposed on the transparent support substrate, where a groove is formed along a dicing line between the adjacent electronic elements, penetrating from the optical elements through the transparent support substrate, with a depth reaching a surface of the wafer or with a depth short of the surface of the wafer; and a light shielding material is applied on side surfaces and a bottom surface of the groove or is filled in the groove, and the light shielding material is applied or formed on a peripheral portion of a surface of the optical element, except for on a light opening in a center of the surface, thereby achieving the objective described above.

An electronic element wafer module according to the present invention is provided, in which a transparent support substrate is disposed facing a plurality of electronic elements formed on a wafer and a plurality of wafer-shaped optical elements are disposed on the transparent support substrate, where a groove is formed along a dicing line between the adjacent electronic elements, penetrating from the optical elements through the transparent support substrate, with a depth reaching a surface of the wafer or with a depth short of the surface of the wafer; and a light shielding material is applied on side surfaces and a bottom surface of the groove or is filled in the groove, and where a light shielding sheet or a light shielding plate is disposed on a surface of the optical element, and a hole is formed in the light shielding sheet or the light shielding plate at a position corresponding to a light opening in a center of the surface of the optical element, thereby achieving the objective described above.

Preferably, in an electronic element wafer module according to the present invention, the plurality of electronic elements are disposed on an electronic element wafer including a penetrating electrode; a resin adhesion layer is formed in a predetermined area on the electronic element wafer except for in an electronic element area; the transparent support substrate covers the electronic element wafer and is fixed on the resin adhesion layer; and the plurality of optical elements are adhered and fixed on the transparent support substrate to be integrated, facing the plurality of respective electronic elements.

Still preferably, in an electronic element wafer module according to the present invention, the dicing line is set at a portion that is in a periphery of an optical function area that does not damage a function of the optical element and an area that does not contact an area of the electronic element.

Still preferably, in an electronic element wafer module according to the present invention, the groove is formed in a gridlike fashion surrounding an optical function area of the optical element and a periphery of the electronic element in a plan view.

Still preferably, in an electronic element wafer module according to the present invention, the light shielding material has a conductive function.

Still preferably, in an electronic element wafer module according to the present invention, the light shielding material is a light shielding/electromagnetic shield resin material.

Still preferably, in an electronic element wafer module according to the present invention, the light shielding material is formed of a resin material including carbon.

Still preferably, in an electronic element wafer module according to the present invention, the optical element is laminated in a plurality of layers with an adhesion layer interposed therebetween, on outer circumference sides of an optical function area in a center portion in a plan view.

Still preferably, in an electronic element wafer module according to the present invention, the optical element includes a lens area provided therein as the optical function area of the center portion, and a spacer section with a predetermined thickness provided therein on the outer circumference sides of the lens area as a pile up section.

Still preferably, in an electronic element wafer module according to the present invention, a lens of the lens area includes a focusing lens.

Still preferably, in an electronic element wafer module according to the present invention, the groove has a depth penetrating from the optical element through the transparent support substrate and reaching the resin adhesion layer and up to a surface of the electronic element wafer.

Still preferably, in an electronic element wafer module according to the present invention, the light shielding material is also formed in the resin adhesion layer.

Still preferably, in an electronic element wafer module according to the present invention, the groove is processed with a dicing blade or a wire saw.

Still preferably, in an electronic element wafer module according to the present invention, a width of the groove is between 100 and 300 micro meter.

Still preferably, in an electronic element wafer module according to the present invention, the light shielding sheet or the light shielding plate is formed by coating a carbon film on a resin substrate.

Still preferably, in an electronic element wafer module according to the present invention, the electronic element is an image capturing element including a plurality of light receiving sections for performing a photoelectric conversion on and capturing an image of image light from a subject.

Still preferably, in an electronic element wafer module according to the present invention, the electronic element includes a light emitting element for emitting output light and a light receiving element for receiving incident light.

Still preferably, in an electronic element wafer module according to the present invention, the optical element is an optical function element for directing output light from the light emitting element straight to be output and refracting incident light to be entered in the light receiving element.

An electronic element module according to the present invention is provided, which is cut at every one or plurality of electronic elements of the electronic element wafer modules according to the present invention in such a manner to leave the light shielding material on cut side surfaces to be a light shielding film, thereby achieving the objective described above.

Preferably, in an electronic element module according to the present invention, a film thickness of the light shielding film is 100 micrometers with a margin of plus or minus 20 micrometers.

A method for manufacturing an electronic element wafer module according to the present invention is provided, in which a transparent support substrate is disposed facing a plurality of electronic elements formed on a wafer and a plurality of wafer-shaped optical elements are disposed on the transparent support substrate, the method comprising: a groove forming step of forming a groove along a dicing line between the adjacent electronic elements, penetrating from the optical elements through the transparent support substrate, with a depth reaching a surface of the wafer or with a depth short of the surface of the wafer; and a light shielding material applying step of applying a light shielding material on side surfaces and a bottom surface of the groove or filling the light shielding material in the groove, and applying or forming the light shielding material on a peripheral portion of a surface of the optical element, except for on a light opening in a center of the surface, thereby achieving the objective described above.

A method for manufacturing an electronic element wafer module according to the present invention is provided, in which a transparent support substrate is disposed facing a plurality of electronic elements formed on a wafer and a plurality of wafer-shaped optical elements are disposed on the transparent support substrate, the method comprising: a light shielding sheet or light shielding plate adhering step of adhering a light shielding sheet or light shielding plate, in which a hole is formed at a position corresponding to a light opening in a center of the surface of the optical element, on the surface of the optical element by aligning the hole with the light opening; a groove forming step of forming a groove along a dicing line between the adjacent electronic elements, penetrating from the light shielding sheet or the light shielding plate and the optical elements through the transparent support substrate, with a depth reaching a surface of the wafer or with a depth short of the surface of the wafer; and a light shielding material applying step of applying a light shielding material on side surfaces and a bottom surface of the groove or filling the light shielding material in the groove, thereby achieving the objective described above.

Preferably, in a method for manufacturing the electronic element wafer module according to the present invention a light shielding material forming step of forming the light shielding material on the peripheral portion of the surface of the optical element, except for on the light opening in the center of the surface includes: a mask forming step of covering an optical function area of the optical element with a mask; a light shielding material entirely-applying step of applying the light shielding material on the mask and the surface of the optical element; and a mask removing step of removing the light shielding material on the mask together with the mask.

Still preferably, in a method for manufacturing the electronic element wafer module according to the present invention, the light shielding material forming step of forming the light shielding material on the peripheral portion of the surface of the optical element, except for on the light opening in the center of the surface includes: a resin material forming step of covering an optical function area of the optical element with a resin material that loses adhesion by heat-curing or foaming; a light shielding material entirely-applying step of applying the light shielding material on the resin material and the surface of the optical element; and a resin material removing step of removing the light shielding material on the resin material together with the resin material by heat processing.

Still preferably, in a method for manufacturing the electronic element wafer module according to the present invention, the light shielding material applying step of applying the light shielding material on the peripheral portion of a surface of the optical element, except for on an optical function area in a center of the surface includes a light shielding material spraying step of allowing a nozzle from a dispenser to scan consecutively in one direction to spray the light shielding material and of stopping the spraying of the light shielding material from the nozzle in the optical function area.

A method for manufacturing an electronic element module according to the present invention further includes: an individualizing step of cutting the groove with an arrow width size along a wide width-direction center portion of the groove for every one or plurality of electronic elements to individualize the electronic elements in such a manner to leave the light shielding material as a light shielding film on cut side surfaces, after the light shielding material applying step in the method for manufacturing the electronic element wafer module according to the present invention, thereby achieving the objective described above.

An electronic information device according to the present invention includes an electronic element module cut off from the electronic element wafer module according to the present invention, as a sensor module in an image capturing section, thereby achieving the objective described above.

An electronic information device according to the present invention includes an electronic element module cut off from the electronic element wafer module according to the present invention, in an information recording and reproducing section, thereby achieving the objective described above.

The functions of the present invention having the structures described above will be described hereinafter.

According to the present invention, in an electronic element wafer module formed with a plurality of electronic element modules, optical elements and transparent support substrates are cut widely along dicing lines to form grooves. Subsequently, surface areas of optical elements including the widely-cut grooves and except for optical openings are applied with a light shielding material. Subsequently, the optical elements and transparent support substrates are narrowly cut along the center portion of the groove in the width direction to be individualized, in such a manner to leave the light shielding material on the side surfaces of the wide grooves. As a result, a light shielding structure covering optical function areas, such as a lens area, and electronic elements therebelow is formed.

Because of this, a simultaneous process can be performed at the wafer level where the electronic element, transparent supporting substrate, and optical element are integrated, for the purpose of improving the productive efficiency and lowering of the productive cost of the sensor module and lens; and further, with regard to the light shielding, a simultaneous process can be performed at the wafer level. Therefore, the light shielding treatment step need not be separately performed for each module as does conventionally, and the light shielding block is not separately needed to achieve the light shielding structure. According to the present invention, it is possible to dispose a light shielding material in one step at a position where the shielding of light is necessary in a wafer state. As a result, it is possible to obtain the light shielding structure easily and quickly, making it possible to largely improve the efficiency for the production compared to the case where the light shielding treatment is performed as an individual process for each module.

When the light shielding material has a conductive function, or the light shielding material is made of a light shielding/electromagnetic shield resin material, the captured image will not be influenced even in a site with a strong magnetic field.

According to the present invention with the structure described above, the light shielding material is applied in the groove of the wafer module, which is formed along a dicing line, and the modules are individualized by cutting the wafer module in such a manner to leave the light shielding material on the side surfaces of the groove, so that the light shielding treatment can be performed at the wafer level. Further, the light shielding treatment step need not be separately performed for each module as done conventionally, and the light shielding block is not separately needed to achieve the light shielding structure, so that it is possible to dispose a light shielding material in one step at a position where the shielding of light is necessary in a wafer state. Therefore, it is possible to obtain the light shielding structure easily and quickly, and it is possible to improve the efficiency for the production.

These and other advantages of the present invention will become apparent to those skilled in the art upon reading and understanding the following detailed description with reference to the accompanying figures.

BRIEF DESCRIPTION OF THE DRAWINGS

FIG. 1(a) is an essential part longitudinal cross sectional view of the case where a light shielding material is filled in a dicing groove. FIG. 1(b) is an essential part longitudinal cross sectional view of the case where a light shielding material is applied on side surfaces and a bottom surface in a dicing groove.

| | |
|---|---|
| 1, 1A | sensor wafer module |
| 2 | image capturing element (electronic element) |
| 3 | penetrated wafer (electronic element wafer) |
| 31 | wiring layer |
| 32 | solder resist |
| 33 | solder ball |
| 4 | resin adhesion layer |
| 5 | glass plate |
| 6 | wafer-shaped optical part (optical element) |
| 6a | light opening |
| 7a | light shielding member (light shielding material) |
| 7 | light shielding film |
| 8 | scribed groove |
| 9 | light shielding sheet or light shielding plate |
| 11 | sensor module |
| DL | dicing line |
| 90 | electronic information device |
| 91 | solid-state image capturing apparatus |
| 92 | memory section |
| 93 | display section |
| 94 | communication section |
| 95 | image output section |

DESCRIPTION OF THE PREFERRED EMBODIMENTS

Hereinafter, as Embodiment 1 of an electronic element wafer module and a method for manufacturing the electronic element wafer module according to the present invention, and further, an electronic element module, which is individualized from the electronic element wafer module, and a method for manufacturing the electronic element module according to the present invention, the case where the present invention is applied to a sensor wafer module and a method for manufacturing the sensor wafer module, and further, to a sensor module, which is individualized from the sensor wafer module, and a method for manufacturing the sensor module, will be described in detail with reference to the attached figures. Furthermore, Embodiment 2 of an electronic information device, such as a camera-equipped cell phone device and a television telephone device, including the sensor module used as an image input device in an image capturing section thereof, will be described in detail with reference to the attached figures.

Embodiment 1

Figure 1:
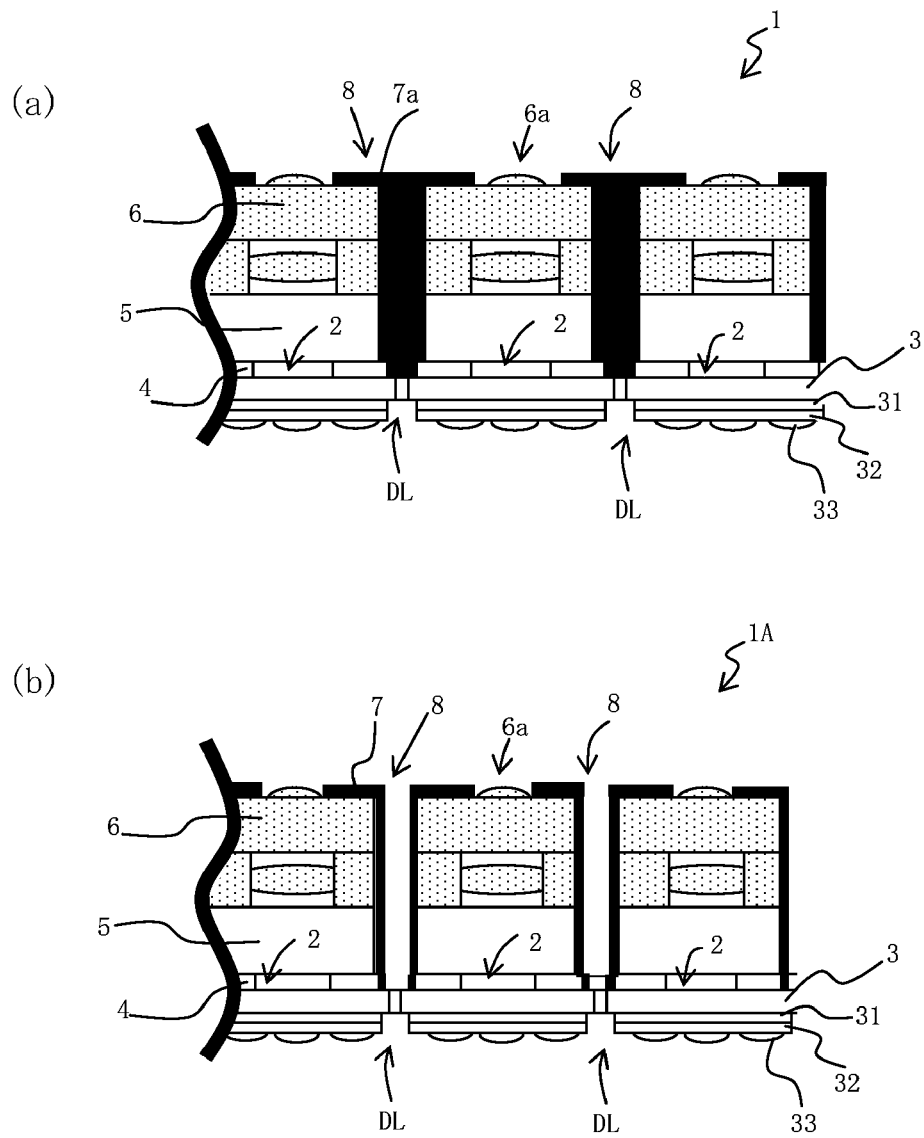
FIG. 1 is an essential part longitudinal cross sectional view illustrating an exemplary structure of a sensor wafer module according to Embodiment 1 of the present invention.

FIG. 1 is an essential part longitudinal cross sectional view illustrating an exemplary structure of a sensor wafer module according to Embodiment 1 of the present invention. FIG. 1(a) is an essential part longitudinal cross sectional view of the case where a light shielding material is filled in a dicing groove. FIG. 1(b) is an essential part longitudinal cross sectional view of the case where a light shielding material is applied on side surfaces and a bottom surface in a dicing groove.

In FIGS. 1(a) and 1(b), a sensor wafer module 1, as an electronic element wafer module according to Embodiment 1, includes: a penetrated wafer 3 as an electronic element wafer; a resin adhesion layer 4; a glass plate 5 as a transparent support substrate; a wafer-shaped optical part 6; and a light shielding member 7a (light shielding material). In the sensor wafer module 1, the glass plate 5 and the wafer-shaped optical part 6 are adhered on top of another in this order, being aligned with each other (positioning), on the penetrated wafer 3 by the resin adhesion layer 4. The penetrated wafer 3 includes image capturing elements 2 (sensor chips), as electronic elements, provided on the wafer surface. Each of the image capturing elements 2 is constituted of a plurality of light receiving sections, which are photoelectric conversion sections (photodiodes) corresponding to a plurality of respective pixels. The penetrated wafer 3 is an electronic element wafer in which a through hole (not shown) is provided between the front surface and the back surface thereof for each of the image capturing elements 2 (sensor chips). The resin adhesion layer 4 is formed around the image capturing elements 2 on the penetrated wafer 3. The glass plate 5 is a cover glass that functions as a transparent support substrate covering the resin adhesion layer 4. The wafer-shaped optical part 6 is provided above the glass plate 5, and a plurality of lens plates are layered therebetween as optical elements for focusing incident light onto the image capturing elements 2. The light shielding member 7a (light shielding material) opens the center portion of the upper most lens plate as a circular light opening 6a (light intake), and shields the rest of the surface portion and side surface portions of each lens plate and the glass plate 5 from light.

On the surface side of the penetrated wafer 3, a large number of image capturing elements 2 are arranged in a matrix. As the plurality of image capturing elements 2, a plurality of light receiving sections are provided, constituting a plurality of pixels for each image capturing element. A plurality of through holes penetrate from the back surface to below the pad (electrode pad) on the front surface for each image capturing element 2. The side walls and the back surface side of the through hole are covered with an insulation film. A wiring layer 31 having contact with the pad is formed to the back surface with the through hole interposed therebetween. A solder resist 32 is formed on the wiring layer 31 and the back surface as an insulation film. A solder ball 33 is formed by opening a site for the solder ball 33 to be formed in the solder resist 32 on the wiring layer 31, so that the solder ball 33 is exposed out of the solder resist 32.

From the back surface side of the sensor wafer module 1 or 1A, only the silicon wafer is cut along grid-shaped dicing lines DL (scribe lines). Further, in order to cut the wafer-shaped optical part 6, glass plate 5, and further, part or all of the resin adhesion layer 4 from the front surface side where the wafer-shaped optical part 6 is disposed, the wafer-shaped optical part 6 and the glass plate 5 are cut along the dicing line DL up to just above the penetrated wafer 3, such as the depth reaching the front surface of the penetrated wafer 3 or the depth prior to the front surface of the penetrated wafer 3, to form a scribed groove 8 with a blade (or a wire with a large diameter), which is thicker than a blade (or a wire) that cut the silicon wafer. Note that a fixing tape is adhered on the back surface side prior to the formation of the scribed groove 8 with the thick blade (or a wire with a large diameter) so that individualized chips will not scatter about. Subsequently, a light shielding resin material (light shielding material) is filled in the scribed groove 8 (in the case of FIG. 1(a)), and the light shielding resin material is also applied on the front surface except for the lens center portion (light opening 6a) of the surface of the optical parts. After the light shielding resin material is solidified, the center portion of the scribed groove 8 filled with the light shielding resin material is cut with a thin blade (or a wire with a small diameter), which has a diameter smaller than the scribed groove 8, up to just above the penetrated wafer 3. As a result, the light shielding member 7a can be cut into two to form a light shielding film 7 at once. In the case of FIG. 1(b), the light shielding member 7a is applied on the side surfaces and the bottom surface of the scribed groove 8, as the light shielding film 7. Thus, there is no need to cut the scribed groove 8 up to just above the penetrated wafer 3 with the blade with a smaller width (or a wire with a smaller diameter) as described above.

That is, the wide dicing groove 8 is formed along the dicing line DL between adjacent image capturing elements 2 (sensor chips), from the wafer-shaped optical part 6 through the glass plate 5 and up to the wafer surface of the penetrated wafer 3 or up to the depth within the resin adhesion layer 4 before the wafer surface. The light shielding member 7a (a light shielding resin material is used herein) is filled in the dicing groove 8 (in the case of FIG. 1(a)), and is applied on the front surface peripheral portion except for on the light opening 6a in the middle of the front surface of the image capturing element 2. The light shielding member 7a can be applied on the side surfaces and the bottom surface of the scribed groove 8, as the light shielding film 7 as illustrated in FIG. 1(b). In addition, the groove width of the dicing groove 8 is between approximately 100 to 300 μm.

The lens stack here as the wafer-shaped optical part 6 (which is a lens module in which two lenses are piled up herein) is formed by laminating a plurality of lenses (two lenses herein) with respective adhesion layers interposed therebetween on the outer circumference side of the optical function area (lens area) in the center portion in the plan view. On the outer circumference side of the lens area, a spacer section (now shown) is disposed as a pile-up section with a predetermined thickness. The lenses of the lens area include a light focusing lens.

The scribed groove 8 is formed in a grid form along the dicing line DL. The dicing line DL is formed in a grid form surrounding the optical function area (lens area) of the wafer-shaped optical part 6 and the image capturing area (a plurality of light receiving sections) of the image capturing element 2 in the plan view. The light shielding member 7a (light shielding resin material) applied on top of the scribed groove 8 is a material that has a conductive function. The light shielding member 7a may be, for example, a resin material including carbon. In addition, the light shielding member 7a (light shielding resin material) may be a metal material.

As described above, the sensor wafer module 1 or 1A is cut at every one (or plurality of) image capturing element 2 of penetrated wafer 3 such that the light shielding resin material (light shielding material) is left on the cut side surfaces to be the light shielding film 7. Subsequently, the fixing tape is removed from the back surface of the sensor wafer module 1 or 1A so that the wafer module is separated into individualized pieces as sensor modules 11 illustrated in FIG. 2.

Herein, a method for manufacturing a sensor wafer module to manufacture the sensor wafer module 1 or 1A having the above structure will be described. Further, the case where the sensor wafer module 1 or 1A is individualized to manufacture the sensor module 11 will be described.

Figure 3:
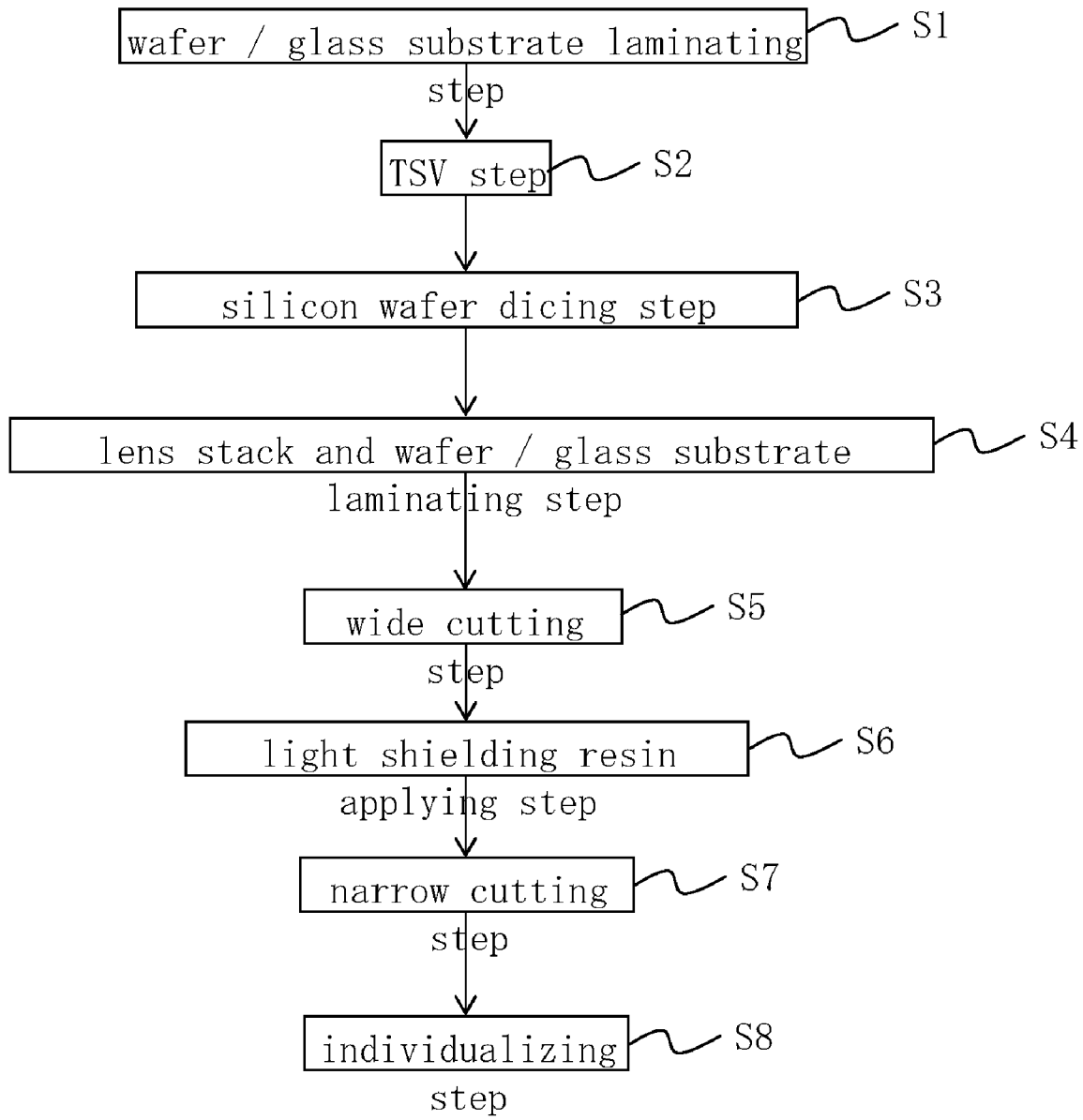
FIG. 3 is a manufacturing flow sheet illustrating the flow of each of the manufacturing steps for describing the method for manufacturing the sensor wafer module in FIG. 1.

FIG. 3 is a manufacturing flow sheet illustrating the flow of each of the manufacturing steps for describing the method for manufacturing the sensor wafer module 1 or 1A in FIG. 1. FIGS. 4(a) to 4(d) and FIGS. 5(a) to 5(c) are each an essential part longitudinal cross sectional view illustrating each of the manufacturing steps for describing the method for manufacturing the sensor wafer module 1 or 1A of FIG. 1.

First, an infrared ray cut film (IR coat) is formed on a surface of a glass substrate and the glass substrate is washed in advance. This glass substrate is prepared as the glass plate 5. The resin adhesion layer 4 is disposed in the periphery of each image capturing element 2 on the penetrated wafer 3. As illustrated in a wafer/glass substrate laminating step S1 of FIGS. 3 and 4(a), the penetrated wafer 3 and the glass plate 5 are adhered by the resin adhesion layer 4. The penetrated wafer 3 functions as an electronic element wafer on which the plurality of image capturing elements 2 are arranged in a matrix.

Figure 4:
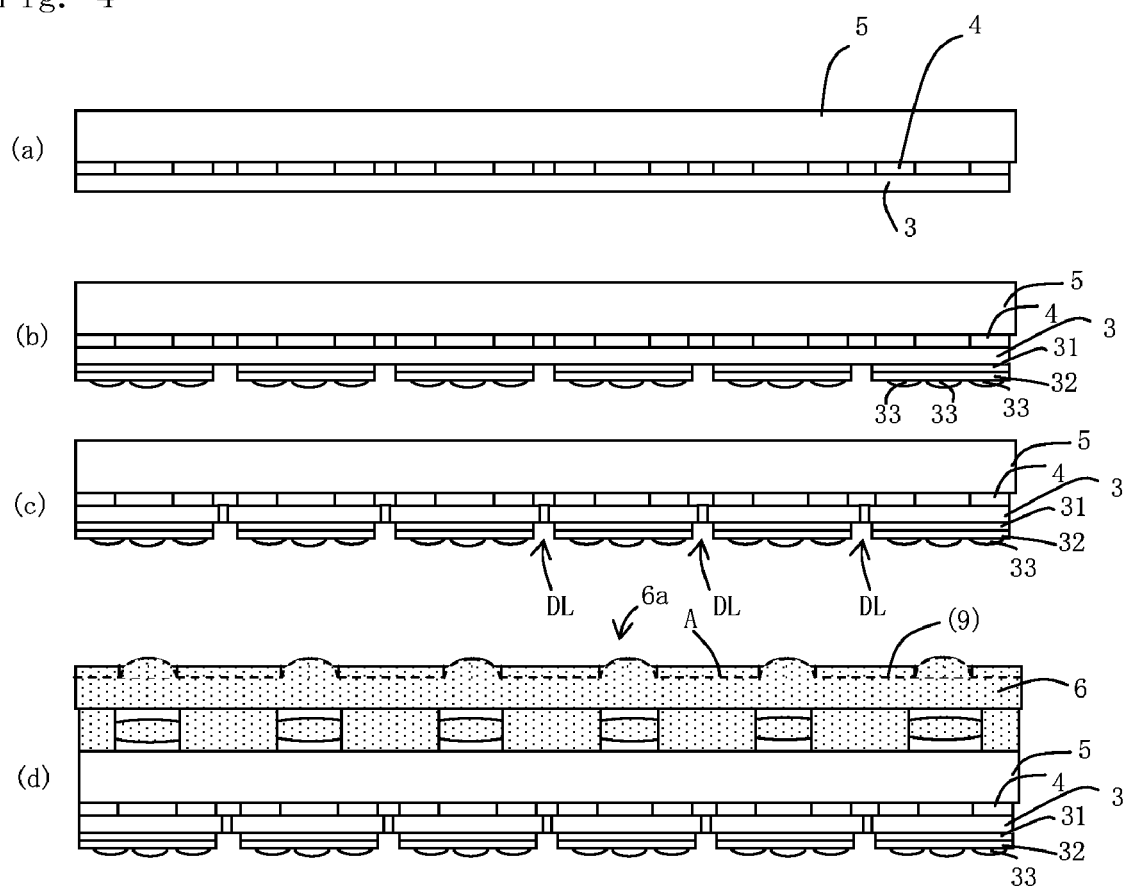
FIGS. 4(a) to 4(d) are each an essential part longitudinal cross sectional view illustrating each of the manufacturing steps (part I) for describing the method for manufacturing the sensor wafer module of FIG. 1.

Next, as illustrated in a TSV step S2 of FIGS. 3 and 4(b), a plurality of through holes (not shown) are formed for each image capturing element 2, the through hole penetrating from the back surface of the penetrated wafer 3 to below the pad (electrode pad) of the front surface. An insulation film (not shown) is formed on side walls of the through hole and the back surface side. The wiring layer 31B, which forms a circuit pattern having contact with the pad, is formed to the back surface with the through hole interposed therebetween. The solder resist 32 is formed as an insulation film on the wiring layer 31 and the back surface, and the solder ball 33 is formed on the wiring layer 31 by opening the solder resist 32. The wiring layer 31, the solder resist 32, and the solder ball 33 are formed for each image capturing element 2 of the penetrated wafer 3.

Subsequently, as illustrated in a silicon wafer dicing step S3 of FIGS. 3 and 4(c), the glass plate 5 is fixed with a tape, and only the silicon wafer (penetrated wafer 3), which is TSV-treated at the TSV step S2, is cut along a scribe line SL.

Subsequently, the position of each lens of the lens stack (lens module) as the wafer-shaped optical part 6 is aligned to correspond to each image capturing element 2 of the penetrated wafer 3. As illustrated in a lens stack and wafer/glass substrate laminating step S4 of FIGS. 3 and 4(d), the lens stack (two lens plates including a focusing lens are laminated and provided vertically) is laminated on the glass plate 5.

Next, after cutting the aforementioned silicon wafer, a fixing tape is adhered on the side of the penetrated wafer 3, which is a silicon wafer, to fix the penetrated wafer 3. As illustrated in a wide cutting step S5 of FIGS. 3 and 5(a), the lens stack and the glass plate 5 are cut just above the surface of the silicon wafer (are cut within the range of the thickness of the resin adhesion layer 4) along the dicing line DL of the penetrated wafer 3 with a blade tool (dicing blade) having a wide cutting width and a thick blade or a wire saw with a wire diameter of approximately 300 μm to form the scribed groove 8. The scribed groove 8 in the depth direction is formed not to contact the silicon wafer side.

Figure 5:
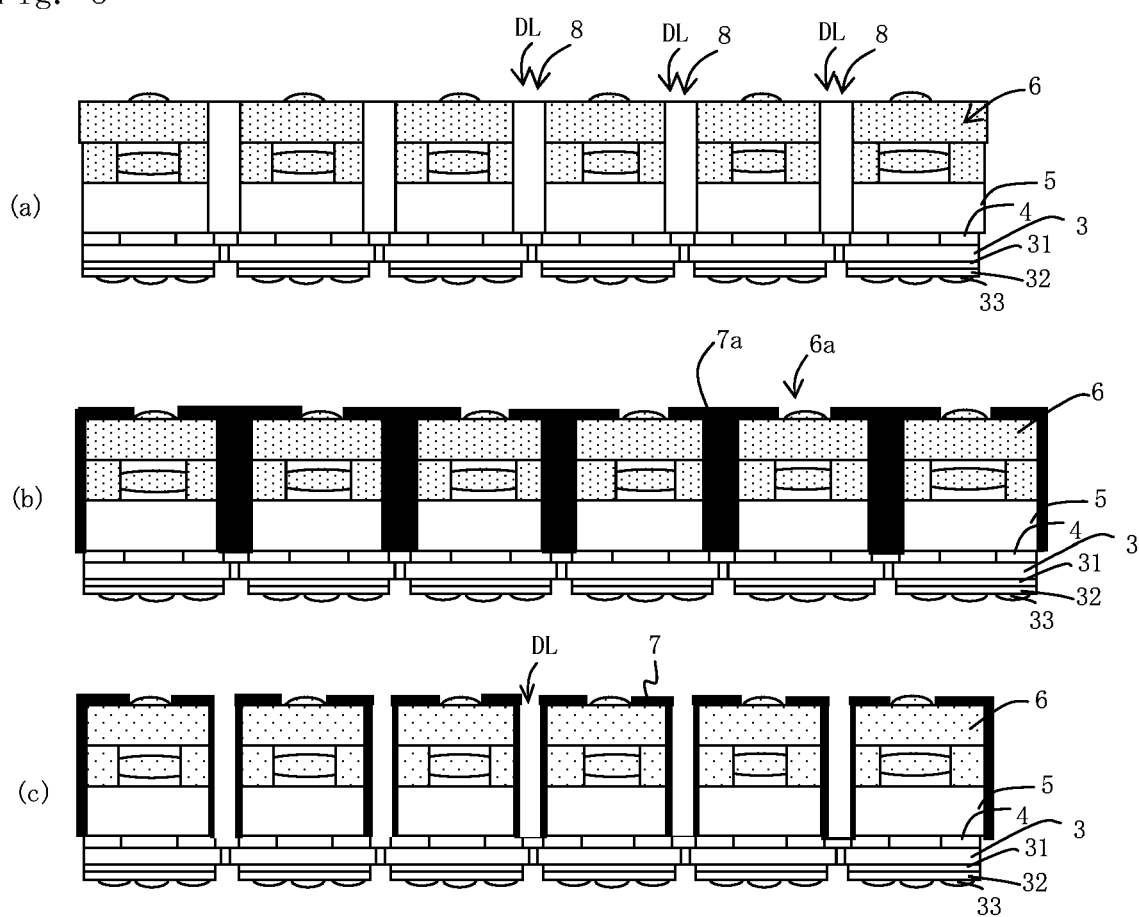
FIGS. 5(a) to 5(c) are each an essential part longitudinal cross sectional view illustrating each of the manufacturing steps (part II) for describing the method for manufacturing the sensor wafer module of FIG. 1.

Subsequently, as illustrated in a light shielding resin applying step S6 of FIGS. 3 and 5(b), the light shielding member 7a (a light shielding resin material, and particularly, a light shielding/electromagnetic shield resin material) is filled in the scribed groove 8, which is formed to penetrate the lens stack and the glass plate 5, before the sensor wafer module 1 or 1A manufactured in a wafer state is individualized into modules (in the case of FIG. 1(a)). The light shielding/electromagnetic shield resin material has a conductive function. That is, the light shielding/electromagnetic shield resin material is applied as the light shielding member 7a on the scribed groove 8 formed on the lens stack and the glass plate 5, and on the peripheral portion except for on the lens function area (light opening 6a) of the lens stack surface. Further, the light shielding/electromagnetic shield resin material is cured by heat or UV light. At this stage, the lens stack surface is applied with the light shielding/electromagnetic shield resin material except for on the lens function area portion (corresponding to the light opening 6a) or is applied on the entire surface (excluding the light opening 6a using a mask).

When the light shielding member 7a, which is a light shielding/electromagnetic shield resin material, is applied with the light shielding resin material except on the lens function area portion (corresponding to the light opening 6a), a nozzle from a dispenser consecutively scans from left to right to draw an outer circumference shape of the lens portion (corresponding to the light opening 6a), such as a circular shape, to spray, from the nozzle, the light shielding resin material (light shielding/electromagnetic shield resin material) of the light shielding member 7a. As a result, it is possible not to apply the light shielding resin material (light shielding/electromagnetic shield resin material) of the light shielding member 7a only on the lens function area portion (corresponding to the light opening 6a). When the light shielding resin material (light shielding/electromagnetic shield resin material) is sprayed from the nozzle of the dispenser, the nozzle consecutively scans in the left and right directions, and when the nozzle reaches the lens function area portion (corresponding to the light opening 6a), the spraying of the light shielding resin material is stopped from the nozzle so that the light shielding resin material is applied on the surface portion except for on the lens function area portion (corresponding to the light opening 6a).

Further, when the light shielding resin material (light shielding/electromagnetic shield resin material) is filled into the scribed groove 8, the nozzle from the dispenser scans in gridlike fashion to fill the light shielding resin material (light shielding/electromagnetic shield resin material) in the scribed groove 8. Subsequently, the resin is removed from unnecessary portions by exposure and the like.

With regard to the filling of the light shielding resin material (light shielding/electromagnetic shield resin material) in the scribed groove 8, the light shielding resin material (light shielding/electromagnetic shield resin material) is required to be filled properly from the lens stack (lens module) as the wafer-shaped optical part 6 to the glass plate 5 in the scribed groove 8. However, it does not matter as to whether or not the light shielding resin material (light shielding/electromagnetic shield resin material) is filled up to the resin adhesion layer 4 just above the surface of the penetrated wafer 3. In either case, it is more effective when the light shielding resin material (light shielding/electromagnetic shield resin material) is filled up to the resin adhesion layer 4 just above the surface of the penetrated wafer 3, in consideration of the shielding of light in the thickness direction of the resin adhesion layer 4.

Further, the light shielding resin material (light shielding/electromagnetic shield resin material) filled in the scribed groove 8 is cured. Subsequently, as illustrated in a narrow cutting step S7 of FIGS. 3 and 5(c), the light shielding resin material (light shielding/electromagnetic shield resin material) is cut with a cutting width of approximately 100 μm, which is smaller than the width of the light shielding resin in the scribed groove 8. That is, the center portion (width direction center portion) of the light shielding resin material (light shielding/electromagnetic shield resin material), which is applied along a gridlike dicing line DL, is cut with a wire saw with a wire diameter of approximately 100 μm or a blade (a dicing blade, for example). Simultaneous to the cutting, light shielding/electromagnetic shield treatment in the periphery of the sensor module is performed at once. In this case, the thickness of the light shielding film 7, which is constituted of the light shielding resin material (light shielding/electromagnetic shield resin material), reaches approximately 100 μm. With regard to the light shielding effect of the light shielding film 7 with approximately 100 μm in thickness, it is recognized that a thickness of approximately 80 μm provides the light shielding effect of approximately 99.6%. Therefore, it is sufficient for the light shielding film 7 when it has a thickness of approximately 100 μm. The cutting error is about 5 to 6 μm with respect to the thickness of the wire. As described above, the filled light shielding resin material (light shielding/electromagnetic shield resin material) is divided from the center portion of the width direction so that it can be attached evenly on each sensor wafer module 1. With regard to the scribed groove 8 filled with the light shielding/electromagnetic shield resin, the width of the scribed groove 8 is defined as wide as possible within the range of the width that does not damage the optical performance (light shielding performance) along the dicing line DL (approximately 300 μm herein). Thus, when the film thickness of the light shielding film 7 is 100 micrometers with a margin of plus or minus 20 micrometers, there is no problem with regard to the light shielding effect.

When the light shielding member 7a is applied as the light shielding film 7 on the side surfaces and the bottom surface of the dicing groove 8 as in the case of FIG. 1(b), there is no need to cut the light shielding film 7 up to just above the penetrated wafer 3 with a thin blade with a narrow width (or a wire with a small diameter) as described above.

Figure 2:
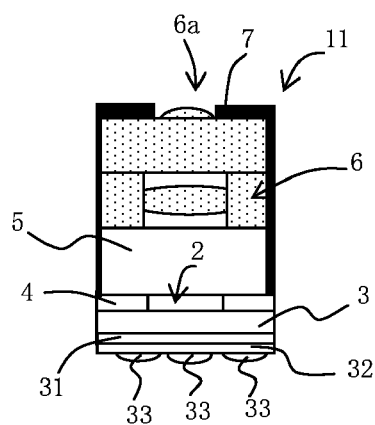
FIG. 2 is a longitudinal cross sectional view illustrating an exemplary essential part structure of a sensor module individualized from the sensor wafer module of FIG. 1.

Further, as illustrated in an individualizing step S8 of FIGS. 3 and 2, when the fixing tape is removed from the silicon wafer side, a large number of sensor modules 11 are separated into individual pieces from the sensor wafer module 1 or 1A.

According to Embodiment 1 as described above, the dicing groove 8 is formed by cutting the wafer-shaped optical part 6 and the glass plate 5 widely along the dicing line DL in the electronic element wafer module 1, on which the plurality of sensor modules 11 are formed. Subsequently, the light shielding material of the light shielding film 7 is applied on the surface area, except for on the light opening 6a, of the center portion of the wafer-shaped optical part 6 including the cut and wide dicing groove 8. Further, the wafer-shaped optical part 6 and the glass plate 5 are cut narrowly along the center of the width direction of the wide dicing groove 8 in such a manner to leave the light shielding material on the side surfaces of the wide dicing groove 8, so that the electronic element wafer module 1 is individualized into the sensor modules 11. As a result, it becomes possible to form the light shielding structure surrounding the optical function area, such as the lens area, and the image capturing elements 2 therebelow.

As described above, the light shielding material is applied in the wide scribed groove 8 formed along the dicing line DL and the cutting is performed so as to leave the light shielding material on the side surfaces of the scribed groove 8 for the individualization. Therefore, the treatment for shielding light can be performed at the wafer level. Further, the light shielding treatment step need not be separately performed for each module as conventionally, and the light shielding block is not separately needed to achieve the light shielding structure, so that it is possible to dispose the light shielding material in one step at a position where the shielding of light is necessary in a wafer state. Therefore, it is possible to obtain the light shielding structure easily and quickly, and it is possible to significantly improve the efficiency of the production. That is, the application of the light shielding material (light shielding/electromagnetic shield resin material) to be the light shielding film 7 can be performed simultaneously in a wafer state. As a result, it becomes possible to significantly improve the processing speed and lower the cost of the product.

In Embodiment 1, the surface of the lens stack is applied with the light shielding/electromagnetic shield resin material except for on the lens function area portion (corresponding to the light opening 6a), or the entire surface is applied with the light shielding/electromagnetic shield resin material. When the light shielding/electromagnetic shield resin material is applied on the entire surface as described above, the lens function area portion (corresponding to the light opening 6a) of the surface of the lens stack is covered with a mask. The light shielding/electromagnetic shield resin material, which is the light shielding member 7a, is formed on the mask and the surface of the lens stack. Substantially, the mask is removed and the light shielding/electromagnetic shield resin material, which is the light shielding member 7a, is formed on the surface, except for on the lens function area portion (corresponding to the light opening 6a), of the surface of the lens stack. Without the limitation to this, it is also possible to form a base layer by, instead of using a mask, using a resin material that loses its adhesion by heat-curing or foaming, and from the light shielding/electromagnetic shield resin material, which is the light shielding member 7a. In summary, a resin material which loses its adhesion by heat or the like is formed as a base layer on the lens function area portion (corresponding to the light opening 6a) of the surface of the lens stack. The light shielding/electromagnetic shield resin material, which is the light shielding member 7a, is applied all over on the entire surface of the lens stack including the lens function area portion. When heat is applied to the light shielding/electromagnetic shield resin material, only the base layer and the light shielding/electromagnetic shield resin material thereabove easily come off. The light shielding/electromagnetic shield resin material, which is the light shielding member 7a, can also be formed this way on the surface, except for on the lens function area portion (corresponding to the light opening 6a), of the surface of the lens stack.

Alternately, a light shielding sheet or light shielding plate with a hole may be adhered on the lens function area portion (corresponding to the light opening 6a) of the surface of the lens stack. The light shielding sheet or the light shielding plate may be adhered when the lens stack is formed. After the aforementioned lens stack and wafer/glass substrate laminating step S4 of FIG. 4(d), a light shielding sheet or light shielding plate 9 may be adhered on the surface of the lens stack, as illustrated by a dashed line A in FIG. 4(d). The light shielding sheet or light shielding plate 9 is formed by coating a carbon film on a polyethylene substrate to have a light shielding effect. An opening of the hole of the light shielding sheet or light shielding plate 9 corresponds to the light opening 6a is processed to cut the corner off. It is needless to say, but the shielding sheet or light shielding plate 9 is not formed in the case of FIG. 4(d).

Embodiment 2

Figure 6:
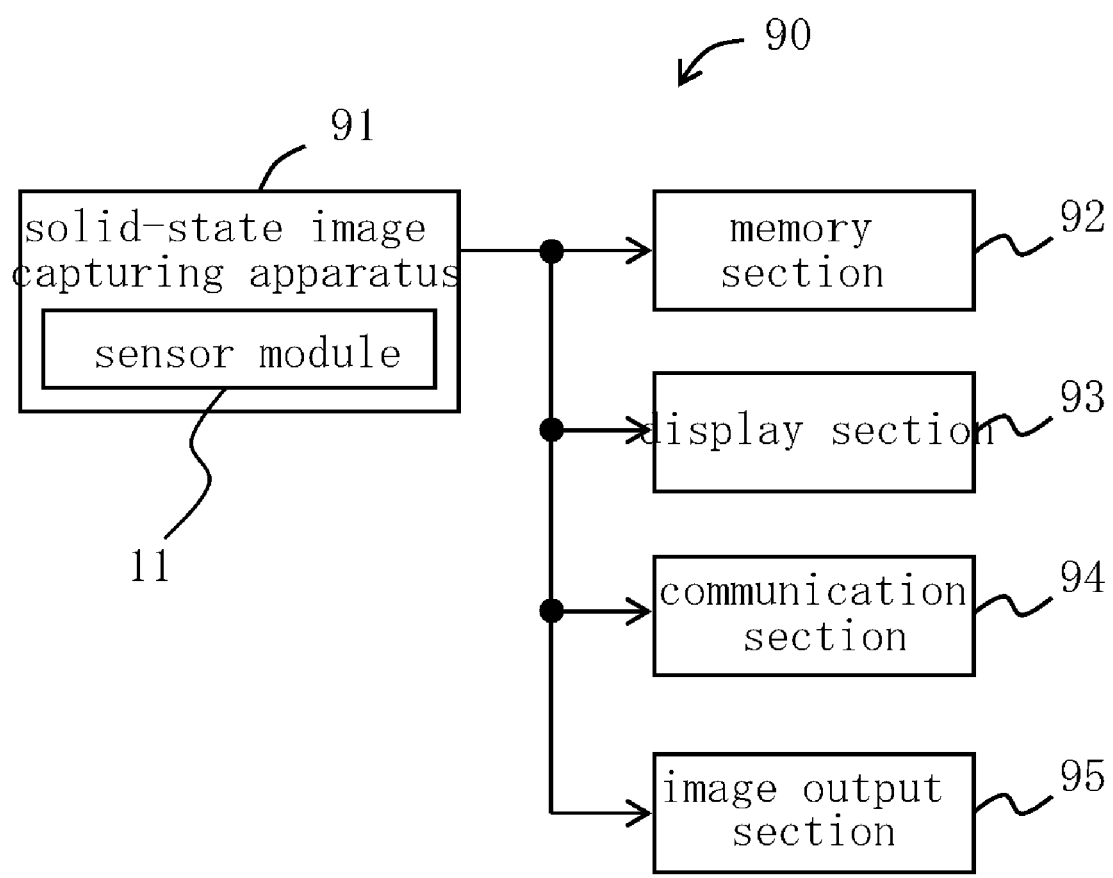
FIG. 6 is a block diagram illustrating an exemplary schematic structure of an electronic information device including a solid-state image capturing apparatus including a sensor module according to Embodiment 1 of the present invention used in an image capturing section thereof, as Embodiment 2 of the present invention.
Figure 7:
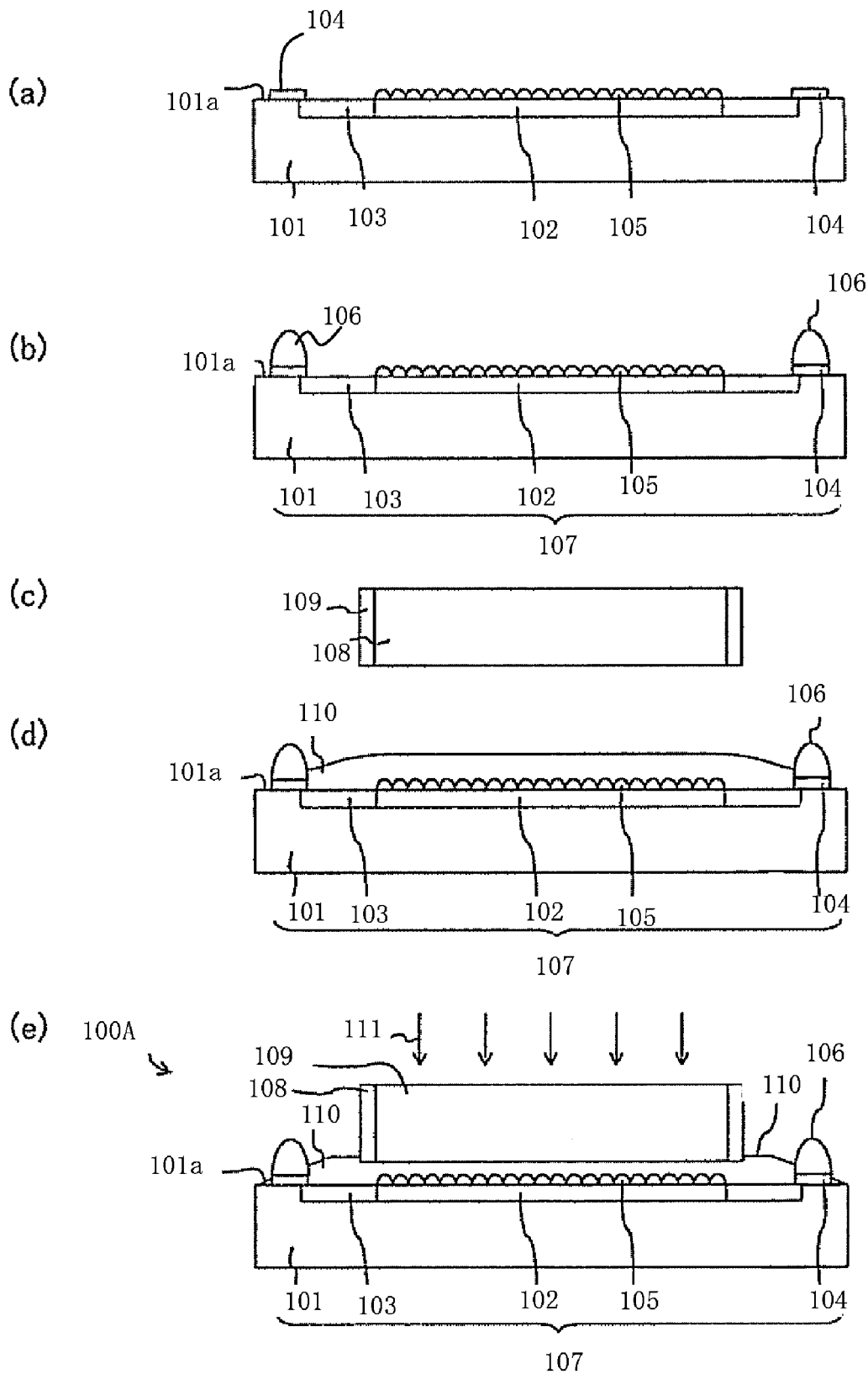
FIGS. 7(a) to 7(e) are each an essential part longitudinal cross sectional view for describing each manufacturing step of a conventional semiconductor image capturing element of Reference 1.
Figure 8:
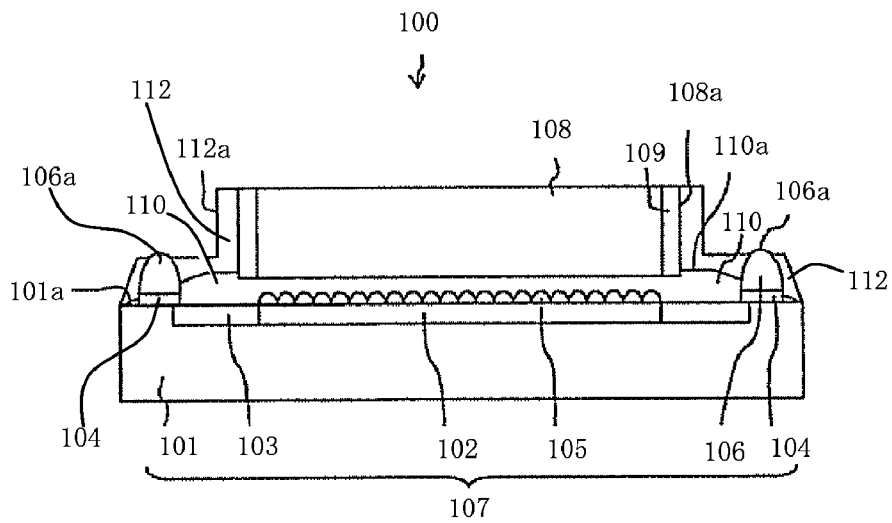
FIG. 8 is an essential part longitudinal cross sectional view for describing a light shielding member forming step following the step of FIG. 7(e).
Figure 9:
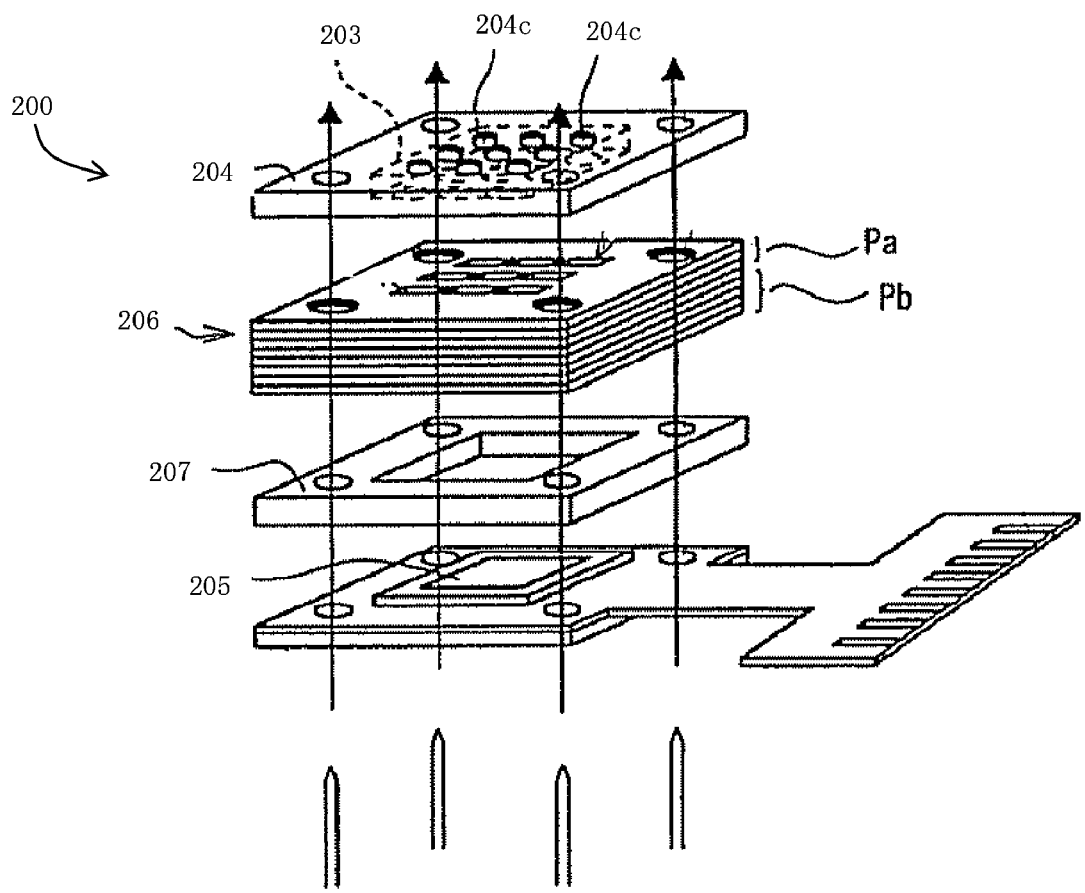
FIG. 9 is an exploded perspective view illustrating a conventional compound eye image capturing apparatus of Reference 2 in an assembling state.
Figure 10:
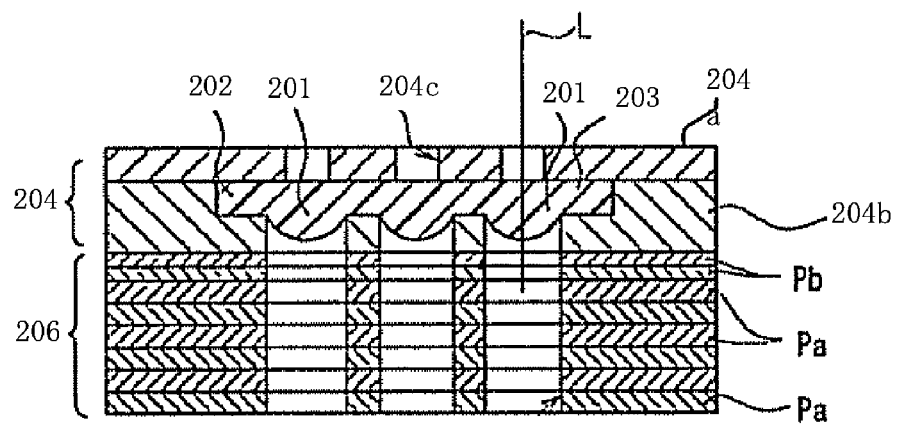
FIG. 10 is a longitudinal cross sectional view of a holder member and a light shielding block portion, holding an optical lens array of the compound eye image capturing apparatus in FIG. 9.
Figure 11:
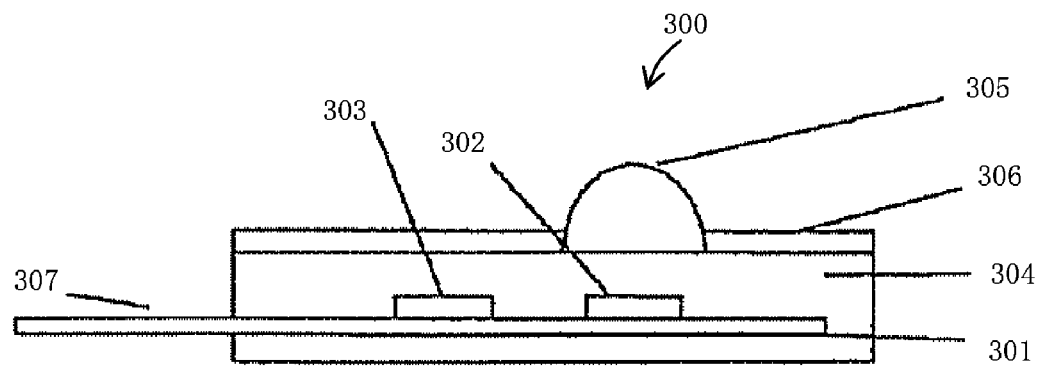
FIG. 11 is an essential part longitudinal cross sectional view of a remote control light receiving module of Reference 3, which is one of conventional optical function modules.

FIG. 6 is a block diagram illustrating an exemplary schematic structure of an electronic information device including a solid-state image capturing apparatus including a sensor module according to Embodiment 1 of the present invention used in an image capturing section thereof, as Embodiment 2 of the present invention.

In FIG. 6, an electronic information device 90 according to Embodiment 2 of the present invention includes: a solid-state image capturing apparatus 91 for performing various signal processing on an image capturing signal from the sensor module 11 according to Embodiment 1 so as to obtain a color image signal; a memory section 92 (e.g., recording media) for data-recording a color image signal from the solid-state image capturing apparatus 91 after a predetermined signal process is performed on the color image signal for recording; a display section 93 (e.g., a liquid crystal display apparatus) for displaying the color image signal from the solid-state image capturing apparatus 91 on a display screen (e.g., liquid crystal display screen) after predetermined signal processing is performed on the color image signal for display; a communication section 94 (e.g., a transmitting and receiving device) for communicating the color image signal from the solid-state image capturing apparatus 91 after predetermined signal processing is performed on the color image signal for communication; and an image output section 95 (e.g., a printer) for printing the color image signal from the solid-state image capturing apparatus 91 after predetermined signal processing is performed for printing. Without any limitations to this, the electronic information device 90 may include at least any of the memory section 92, the display section 93, the communication section 94, and the image output section 95, other than the solid-state image capturing apparatus 91.

As the electronic information device 90, an electronic information device that includes an image input device is conceivable, such as a digital camera (e.g., digital video camera or digital still camera), an image input camera (e.g., a monitoring camera, a door phone camera, a camera equipped in a vehicle including a back-view monitoring camera equipped in a vehicle, or a television camera), a scanner, a facsimile machine, a television telephone device, a camera-equipped cell phone device, or a personal digital assistant (PDA).

Therefore, according to Embodiment 2 of the present invention, the color image signal from the solid-state image capturing apparatus 91 can be: displayed on a display screen properly, printed out on a sheet of paper using an image output section 95, communicated properly as communication data via a wire or a radio, stored properly at the memory section 92 by performing predetermined data compression processing; and various data processes can be properly performed.

Without the limitation to the electronic information device 90 according to Embodiment 2, the electronic information device may be a pick up apparatus including the electronic element module of the present invention used in an information recording and reproducing section thereof. In this case, the optical element of the pick up apparatus is an optical function element that directs output light straight to be output and refracting and guiding incident light in a predetermined direction. In addition, as the electronic element of the pick up apparatus, a light emitting element for emitting output light and a light receiving element for receiving incident light are included.

As described above, the present invention is exemplified by the use of its preferred Embodiments 1 and 2. However, the present invention should not be interpreted solely based on Embodiments 1 and 2 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 and 2 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of an electronic element wafer module and a method for manufacturing the electronic element wafer module. In the electronic element wafer module, a plurality of lenses for focusing incident light or a plurality of optical function elements for directing output light straight and refracting and guiding incident light in a predetermined direction; and an image capturing element including a plurality of light receiving sections corresponding to respective lenses for performing a photoelectric conversion on and capturing an image of image light from a subject, or a light emitting element for emitting output light and a light receiving element for receiving incident light, are modularized (integrated) in a plural number. Further, the present invention can be applied in the field of an electronic element module manufactured by simultaneously cutting the electronic element wafer module into each of the electronic element modules, and a method for manufacturing the electronic element module. Still further, the present invention can be applied in the field of an electronic information device, such as a digital camera (e.g., a digital video camera or a digital still camera), an image input camera (e.g., a car-mounted camera), a scanner, a facsimile machine, a television telephone device, a camera-equipped cell phone device or a personal digital assistant (PDA), including a sensor module as an image input device (e.g., a car-mounted camera) used in an image capturing section of the electronic information device. Further, the present invention can be applied in the field of a pick up apparatus including the electronic element module used in an information recording and reproducing section thereof. According to the present invention, the light shielding material is applied in the groove of the wafer module, which is formed along a dicing line, and the modules are individualized by cutting the wafer module in such a manner to leave the light shielding material on the side surfaces of the groove, so that the light shielding treatment can be performed at the wafer level. Further, the light shielding treatment step need not be separately performed for each module as done conventionally, and the light shielding block is not separately needed to achieve the light shielding structure, so that it is possible to dispose the light shielding material in one step at a position where the shielding of light is necessary in a wafer state. Therefore, it is possible to obtain the light shielding structure easily and quickly, and it is possible to improve the efficiency for production.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An electronic element wafer module in which a transparent support substrate is disposed facing a plurality of electronic elements formed on a wafer and a plurality of wafer-shaped optical elements are disposed on the transparent support substrate,
wherein a groove is formed along a dicing line between the adjacent electronic elements, penetrating from the optical elements through the transparent support substrate, with a depth reaching a surface of the wafer or with a depth short of the surface of the wafer; and a light shielding material is applied on side surfaces and a bottom surface of the groove or is filled in the groove, and the light shielding material is applied or formed on a peripheral portion of a surface of the optical element, except for on a light opening in a center of the surface.

2. An electronic element wafer module according to claim 1, wherein:
the plurality of electronic elements are disposed on an electronic element wafer including a penetrating electrode;
a resin adhesion layer is formed in a predetermined area on the electronic element wafer except for in an electronic element area;
the transparent support substrate covers the electronic element wafer and is fixed on the resin adhesion layer; and
the plurality of optical elements are adhered and fixed on the transparent support substrate to be integrated, facing the plurality of respective electronic elements.

3. An electronic element wafer module according to claim 2, wherein the groove has a depth penetrating from the optical element through the transparent support substrate and reaching the resin adhesion layer and up to a surface of the electronic element wafer.

4. An electronic element wafer module according to claim 3, wherein the light shielding material is also formed in the resin adhesion layer.

5. An electronic element wafer module according to claim 1, wherein the dicing line is set at a portion that is in a periphery of an optical function area that does not damage a function of the optical element and an area that does not contact an area of the electronic element.

6. An electronic element wafer module according to claim 1, wherein the groove is formed in a gridlike fashion surrounding an optical function area of the optical element and a periphery of the electronic element in a plan view.

7. An electronic element wafer module according to claim 1, wherein the light shielding material has a conductive function.

8. An electronic element wafer module according to claim 7, wherein the light shielding material is formed of a resin material including carbon.

9. An electronic element wafer module according to claim 1, wherein the light shielding material is a light shielding/electromagnetic shield resin material.

10. An electronic element wafer module according to claim 9, wherein the light shielding material is formed of a resin material including carbon.

11. An electronic element wafer module according to claim 1, wherein the optical element is laminated in a plurality of layers with an adhesion layer interposed therebetween, on outer circumference sides of an optical function area in a center portion in a plan view.

12. An electronic element wafer module according to claim 11, wherein the optical element includes a lens area provided therein as the optical function area of the center portion, and a spacer section with a predetermined thickness provided therein on the outer circumference sides of the lens area as a pile up section.

13. An electronic element wafer module according to claim 12, wherein a lens of the lens area includes a focusing lens.

14. An electronic element wafer module according to claim 1, wherein the groove is processed with a dicing blade or a wire saw.

15. An electronic element wafer module according to claim 14, wherein a width of the groove is between 100 and 300 micro meter.

16. An electronic element wafer module according to claim 1, wherein the electronic element is an image capturing element including a plurality of light receiving sections for performing a photoelectric conversion on and capturing an image of image light from a subject.

17. An electronic information device including an electronic element module cut off from the electronic element wafer module according to claim 16, as a sensor module in an image capturing section.

18. An electronic element wafer module according to claim 1, wherein the electronic element includes a light emitting element for emitting output light and a light receiving element for receiving incident light.

19. An electronic element wafer module according to claim 18, wherein the optical element is an optical function element for directing output light from the light emitting element straight to be output and refracting incident light to be entered in the light receiving element.

20. An electronic information device including an electronic element module cut off from the electronic element wafer module according to claim 19, in an information recording and reproducing section.

21. An electronic information device including an electronic element module cut off from the electronic element wafer module according to claim 18, in an information recording and reproducing section.

22. An electronic element module which is cut at every one or plurality of electronic elements of the electronic element wafer modules according to claim 1 in such a manner to leave the light shielding material on cut side surfaces to be a light shielding film.

23. An electronic element module according to claim 22, wherein a film thickness of the light shielding film is 100 micrometers with a margin of plus or minus 20 micrometers.

24. An electronic element wafer module in which a transparent support substrate is disposed facing a plurality of electronic elements formed on a wafer and a plurality of wafer-shaped optical elements are disposed on the transparent support substrate,
wherein a groove is formed along a dicing line between the adjacent electronic elements, penetrating from the optical elements through the transparent support substrate, with a depth reaching a surface of the wafer or with a depth short of the surface of the wafer; and a light shielding material is applied on side surfaces and a bottom surface of the groove or is filled in the groove, and
wherein a light shielding sheet or a light shielding plate is disposed on a surface of the optical element, and a hole is formed in the light shielding sheet or the light shielding plate at a position corresponding to a light opening in a center of the surface of the optical element.

25. An electronic element wafer module according to claim 24, wherein:
the plurality of electronic elements are disposed on an electronic element wafer including a penetrating electrode;
a resin adhesion layer is formed in a predetermined area on the electronic element wafer except for in an electronic element area;
the transparent support substrate covers the electronic element wafer and is fixed on the resin adhesion layer; and
the plurality of optical elements are adhered and fixed on the transparent support substrate to be integrated, facing the plurality of respective electronic elements.

26. An electronic element wafer module according to claim 25, wherein the groove has a depth penetrating from the optical element through the transparent support substrate and reaching the resin adhesion layer and up to a surface of the electronic element wafer.

27. An electronic element wafer module according to claim 26, wherein the light shielding material is also formed in the resin adhesion layer.

28. An electronic element wafer module according to claim 24, wherein the dicing line is set at a portion that is in a periphery of an optical function area that does not damage a function of the optical element and an area that does not contact an area of the electronic element.

29. An electronic element wafer module according to claim 24, wherein the groove is formed in a gridlike fashion surrounding an optical function area of the optical element and a periphery of the electronic element in a plan view.

30. An electronic element wafer module according to claim 24, wherein the light shielding material has a conductive function.

31. An electronic element wafer module according to claim 30, wherein the light shielding material is formed of a resin material including carbon.

32. An electronic element wafer module according to claim 24, wherein the light shielding material is a light shielding/electromagnetic shield resin material.

33. An electronic element wafer module according to claim 32, wherein the light shielding material is formed of a resin material including carbon.

34. An electronic element wafer module according to claim 24, wherein the optical element is laminated in a plurality of layers with an adhesion layer interposed therebetween, on outer circumference sides of an optical function area in a center portion in a plan view.

35. An electronic element wafer module according to claim 34, wherein the optical element includes a lens area provided therein as the optical function area of the center portion, and a spacer section with a predetermined thickness provided therein on the outer circumference sides of the lens area as a pile up section.

36. An electronic element wafer module according to claim 35, wherein a lens of the lens area includes a focusing lens.

37. An electronic element wafer module according to claim 24, wherein the groove is processed with a dicing blade or a wire saw.

38. An electronic element wafer module according to claim 37, wherein a width of the groove is between 100 and 300 micro meter.

39. An electronic element wafer module according to claim 24, wherein the light shielding sheet or the light shielding plate is formed by coating a carbon film on a resin substrate.

40. An electronic element wafer module according to claim 24, wherein the electronic element is an image capturing element including a plurality of light receiving sections for performing a photoelectric conversion on and capturing an image of image light from a subject.

41. An electronic information device including an electronic element module cut off from the electronic element wafer module according to claim 40, as a sensor module in an image capturing section.

42. An electronic element wafer module according to claim 24, wherein the electronic element includes a light emitting element for emitting output light and a light receiving element for receiving incident light.

43. An electronic information device including an electronic element module cut off from the electronic element wafer module according to claim 42, in an information recording and reproducing section.

44. An electronic element wafer module according to claim 42, wherein the optical element is an optical function element for directing output light from the light emitting element straight to be output and refracting incident light to be entered in the light receiving element.

45. An electronic information device including an electronic element module cut off from the electronic element wafer module according to claim 44, in an information recording and reproducing section.

46. An electronic element module which is cut at every one or plurality of electronic elements of the electronic element wafer modules according to claim 24 in such a manner to leave the light shielding material on cut side surfaces to be a light shielding film.

47. An electronic element module according to claim 46, wherein a film thickness of the light shielding film is 100 micrometers with a margin of plus or minus 20 micrometers.

48. A method for manufacturing an electronic element wafer module in which a transparent support substrate is disposed facing a plurality of electronic elements formed on a wafer and a plurality of wafer-shaped optical elements are disposed on the transparent support substrate, the method comprising:
   a groove forming step of forming a groove along a dicing line between the adjacent electronic elements, penetrating from the optical elements through the transparent support substrate, with a depth reaching a surface of the wafer or with a depth short of the surface of the wafer; and
   a light shielding material applying step of applying a light shielding material on side surfaces and a bottom surface of the groove or filling the light shielding material in the groove, and applying or forming the light shielding material on a peripheral portion of a surface of the optical element, except for on a light opening in a center of the surface.

49. A method for manufacturing the electronic element wafer module according to claim 48, wherein a light shielding material forming step of forming the light shielding material on the peripheral portion of the surface of the optical element, except for on the light opening in the center of the surface includes:
   a mask forming step of covering an optical function area of the optical element with a mask;
   a light shielding material entirely-applying step of applying the light shielding material on the mask and the surface of the optical element; and
   a mask removing step of removing the light shielding material on the mask together with the mask.

50. A method for manufacturing the electronic element wafer module according to claim 48, wherein the light shielding material forming step of forming the light shielding material on the peripheral portion of the surface of the optical element, except for on the light opening in the center of the surface includes:
   a resin material forming step of covering an optical function area of the optical element with a resin material that loses adhesion by heat-curing or foaming;
   a light shielding material entirely-applying step of applying the light shielding material on the resin material and the surface of the optical element; and
   a resin material removing step of removing the light shielding material on the resin material together with the resin material by heat processing.

51. A method for manufacturing the electronic element wafer module according to claim 48, wherein the light shielding material applying step of applying the light shielding material on the peripheral portion of a surface of the optical element, except for on an optical function area in a center of the surface includes a light shielding material spraying step of allowing a nozzle from a dispenser to scan consecutively in one direction to spray the light shielding material and of stopping the spraying of the light shielding material from the nozzle in the optical function area.

52. A method for manufacturing an electronic element module, further comprising: an individualizing step of cutting the groove with a narrow width size along a wide width-direction center portion of the groove for every one or plurality of electronic elements to individualize the electronic elements in such a manner to leave the light shielding material as a light shielding film on cut side surfaces,
   after the light shielding material applying step in the method for manufacturing the electronic element wafer module according to claim 48.

* * * * *